United States Patent
Damodaran et al.

(10) Patent No.: US 8,930,783 B2
(45) Date of Patent: Jan. 6, 2015

(54) PBIST READ ONLY MEMORY IMAGE COMPRESSION

(71) Applicant: Texas Instruments Incorporated, Dallas, TX (US)

(72) Inventors: Raguram Damodaran, Plano, TX (US); Naveen Bhoria, Plano, TX (US); Aman Kokrady, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 13/709,188

(22) Filed: Dec. 10, 2012

(65) Prior Publication Data
US 2014/0164855 A1   Jun. 12, 2014

(51) Int. Cl.
*G01R 31/28* (2006.01)
*G11C 29/12* (2006.01)
*G01R 31/3185* (2006.01)
*G11C 29/36* (2006.01)

(52) U.S. Cl.
CPC ........ *G11C 29/12* (2013.01); *G01R 31/318555* (2013.01); *G01R 31/318519* (2013.01); *G11C 29/36* (2013.01)
USPC ............................................ 714/733; 714/30

(58) Field of Classification Search
CPC ............... G01R 31/318519; G01R 31/318555; G11C 29/36
USPC ....................... 714/733, 30, 738, 42, 718, 725
See application file for complete search history.

(56) References Cited

U.S. PATENT DOCUMENTS

| 5,918,003 A | * | 6/1999 | Koch et al. ..................... 714/30 |
| 5,946,247 A | * | 8/1999 | Osawa et al. .................. 365/201 |
| 2002/0104051 A1 | * | 8/2002 | Gupta ............................ 714/733 |

FOREIGN PATENT DOCUMENTS

EP     1388788     *   8/2002   ......... G01R 31/3187

* cited by examiner

*Primary Examiner* — Guy Lamarre
(74) *Attorney, Agent, or Firm* — Robert D. Marshall, Jr.; Frederick J. Telecky, Jr.

(57) ABSTRACT

A programmable Built In Self Test (pBIST) system used to test embedded memories where a plurality of memories requiring different testing conditions are incorporated in an SOC. The pBIST Read Only Memory storing the test setup data is organized to eliminate multiple instances of test setup data for similar embedded memories.

9 Claims, 3 Drawing Sheets a # PBIST READ ONLY MEMORY IMAGE COMPRESSION

TECHNICAL FIELD OF THE INVENTION

The technical field of this invention is high speed memory testing, and more particularly a built-in self-test (BIST) system for embedded memories.

BACKGROUND OF THE INVENTION

Testing fabricated integrated circuits to determine proper operation has always been a challenging task, particularly with regard to on-board memory functions. There are two major types of device malfunctions caused by design defects. A design defect arises when the integrated circuit was manufactured to a design specification that did not provide proper function for the intended use purpose. Such a defect affects any manufactured integrated circuit until the design defect is corrected. The integrated circuit manufacturer must detect and correct such defects before shipping large number of devices to customers to avoid a costly recall. In contrast to a design defect, a manufacturing defect involves some fault in the manufacture of the integrated circuit. A manufacturing defect will generally affect less than all parts manufactured. Such defects are corrected by identification and correction of the manufacturing fault.

Most integrated circuit manufacturers test integrated circuits for proper operation before shipment to customers. Increasing integrated circuit complexity makes this testing increasingly difficult. Rather than rely on increasingly expensive external testing devices, many manufacturers test integrated circuits using a built-in self-test (BIST). BIST uses circuits on the integrated circuit designed solely to test the integrated circuit. When triggered either automatically in circuit operation or by an external test device, the BIST circuits produce a set of test conditions run on the ordinary circuit hardware. Comparison of the state of the integrated circuit following test to an expected state indicates whether the integrated circuit passed. An example of such a test is writing to a read/write memory and recalling the data written. A match between the data written and the data read passes the test. BIST typically involves other more complex tests.

A subset of BIST is programmable built-in self test (pBIST) that uses a general purpose test engine programmed by a set of instructions. This set of test instructions is typically stored on the integrated circuit in a read only memory (ROM) and includes instructions particularly developed for that integrated circuit. pBIST enables re-use of hardware and test instructions to cover a family of similar but not identical integrated circuits.

U.S. Pat. No. 7,324,392 entitled ROM-Based Memory Testing includes a description of an exemplary set of instructions for use in a pBIST. This patent is incorporated by reference in its entirety.

In conventional VLSI systems memory testing is done in three steps. In the first step hardwired logic (often available through third-party vendors, examples are memBIST (MBIST) use algorithms developed before the device is committed to tape-out. Determining the detailed make-up of hardwired logic is not feasible at this time. It is impossible to predict the appropriate hardware circuits because the necessary information comes from process model drivers during the process qualification window. Secondly, conventional memory testing attempts to close testing gaps using CPU based techniques. These techniques have a number of limitations. A major limitation is the CPU interface with largely inaccessible memory functions. The inability to do back-to-back accesses to all memories is another severe limitation. Thirdly, during memory testing while the device is in wafer form direct memory access (DMA) external memory accesses cannot be accomplished at full processor speed. This may result in a significant number of failures not being observable.

SUMMARY OF THE INVENTION

An SOC (System On Chip) usually contains a plurality of memories. A pBIST (programmable Built In Self Test) module is employed to test the embedded memories.

This invention describes a novel ROM (Read Only Memory) organization within the pBIST that reduces the amount of ROM required to store memory testing and configuration information.

BRIEF DESCRIPTION OF THE DRAWINGS

These and other aspects of this invention are illustrated in the drawings, in which.

DETAILED DESCRIPTION OF PREFERRED EMBODIMENTS

SRAM/memory structures of different devices vary by technology, design and implementation. To test memories effectively the address access pattern sequence of the memory testing algorithm should follow a particular pattern that sensitizes and tests the electrical structure within the memory.

In a simple memory structure the physical addresses and logical addresses are contiguous and are matched.

Effective testing can be preformed with simple algorithms that linearly increment or decrement addresses. In these memories any possible address scrambling automatically matches the input to the output. Namely bit <0> of the input goes to bit <0> of the output and so on.

Figure 1:
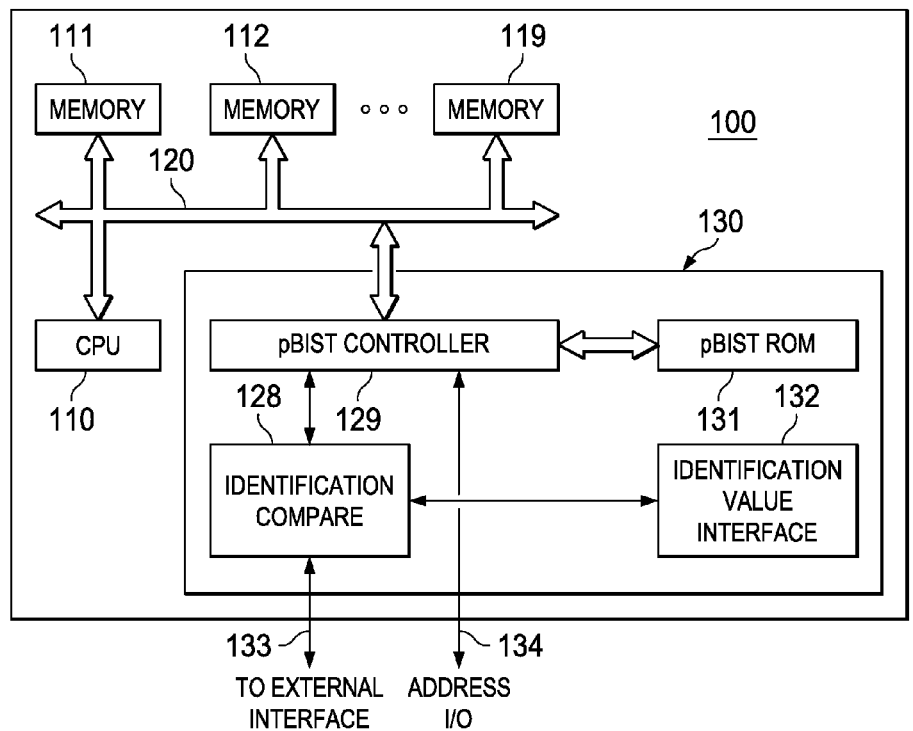
FIG. 1 is a block diagram of a programmable BIST (pBist) unit built into a CPU/memory function of the prior art.

FIG. 1 illustrates a representative prior art integrated circuit (IC), a system-on-chip (SOC) device 100 that includes programmable built-in self-test (pBIST) 130.

The SOC device 100 includes multiple modules that can be highly complex to test. SOC 100 includes central processing unit (CPU) 110 and memories 111 and 112 through 119 coupled by bus 120. Other SOC devices may include multiple processors, complex assemblages of memory and cache subsystems, peripheral devices and interfaces, various types of memory storage such as random access memory (RAM), read only memory (ROM) and possibly various types of alterable memory or flash ROM.

The programmable built-in self-test unit pBIST 130 includes a pBIST controller 129, pBIST ROM 131, an ID Value interface 132, ID Compare unit 128 and external interface 133. pBIST controller 129 controls SOC tests in much the same fashion as CPU 110 controls the normal operation of integrated circuit 100. pBIST unit 130 is controlled by test instructions stored in pBIST ROM 131. pBIST unit 130 may couple to circuits outside integrated circuit 100 via external interface 133. Addresses enter and exit pBist unit 130 via Address I/O 134.

pBIST controller 129 selects a particular pBIST controller within a group of pBIST controllers by using a pBIST ID (identification) value interface 132. The pBIST ID value is typically a five-bit value that allows selection of up to thirty-one pBIST controllers.

Figure 2:
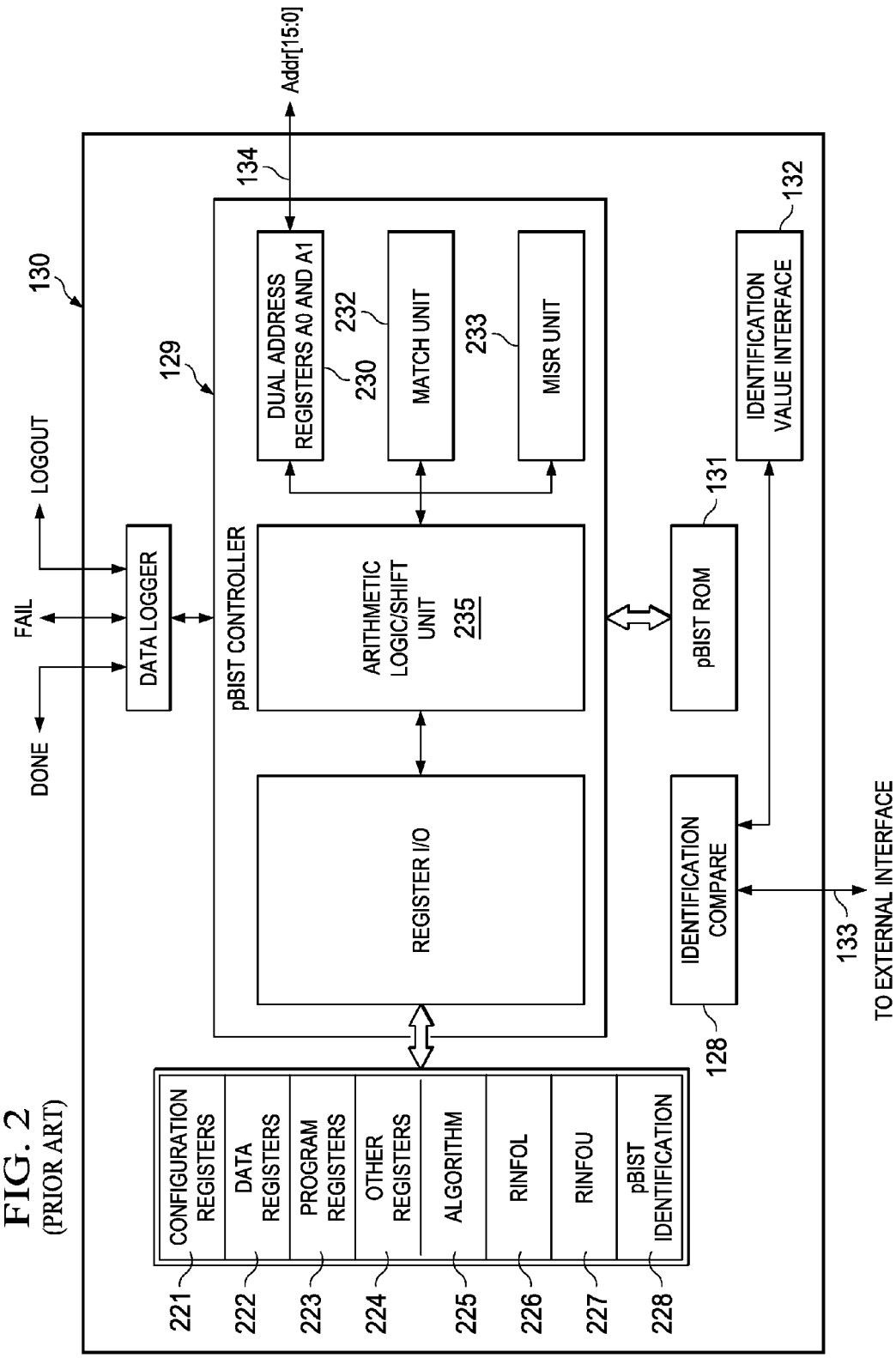
FIG. 2 is a detailed block diagram of a pBist controller of the prior art.

FIG. 2 is a block diagram of functional units included in prior art pBist 130. pBIST unit 130 includes pBIST controller 129, registers 221 through 228, dual address register 230, match unit 232 and multiple input signature register (MISR) unit 233. Addr[15:0] I/O 134 allows for input or output of pBist addresses.

Configuration registers 221 through 228 are memory mapped within the address space of CPU 110. Thus CPU 110 can read from or write to any register 221 through 228 by a memory operation to the corresponding address. Configuration registers 221 through 228 control the configuration and the operational mode of pBIST unit 130. Data registers 222 store test data recalled from pBIST ROM 131. Program registers 223 store test program instructions recalled from pBIST ROM 131. Other registers 224 include miscellaneous general-purpose registers. Configuration registers 221 includes four additional registers algorithm register 225, upper RAM information (RINFOL) register 226, lower RAM information (RINFOU) register 227 and pBIST ID register 228 which will be more fully discussed below.

Algorithm register 225 is actually an algorithm mask register. Bit [0] of this register indicates whether the first algorithm stored in pBIST ROM 131 would be executed. Bit [1] indicates whether the second algorithm is executed and so on. A total of 32 algorithms stored in pBist ROM 131 can be controlled the 32-bit word width of algorithm register 225. For an algorithm to be executed, both the corresponding bit of algorithm register 225 and a valid bit in the previous algorithm header must be set.

RINFOL register 226 and RINFOU register 227 are group mask registers similar to algorithm register 225. RINFOL register 226 and RINFOU register 227 indicate whether a particular RAM group is tested. This capability is provided because not all algorithms can be run on all memories. For a particular RAM group to be tested the corresponding bit in RINFOL register 226 or RINFOU register 227 and the valid bit in the previous RAM group header must both be set. RINFOL register 226 indicates the validity of RAM groups 0 to 31 and RINFOU register 227 indicates the validity of RAM groups 32 to 63.

pBIST ID register 228 is a memory mapped register that is loaded with a pBIST ID at the beginning of a programming sequence to specify which of a multiple of pBIST controllers 129 is being programmed by an external tester or by the local CPU 110. Upon being reset, pBIST register assumes a value of 0x0000. Each pBIST controller 129 is assigned a unique ID value input via ID value interface 132 when the SOC integrated circuit is designed. This may be embodied by simply tying off the five-bit field to either a high or to a low reference voltage to form a five-bit ID value. Dual Address registers 230 are used in accessing memory, such as memories 111, 112, through 119.

Figure 3:
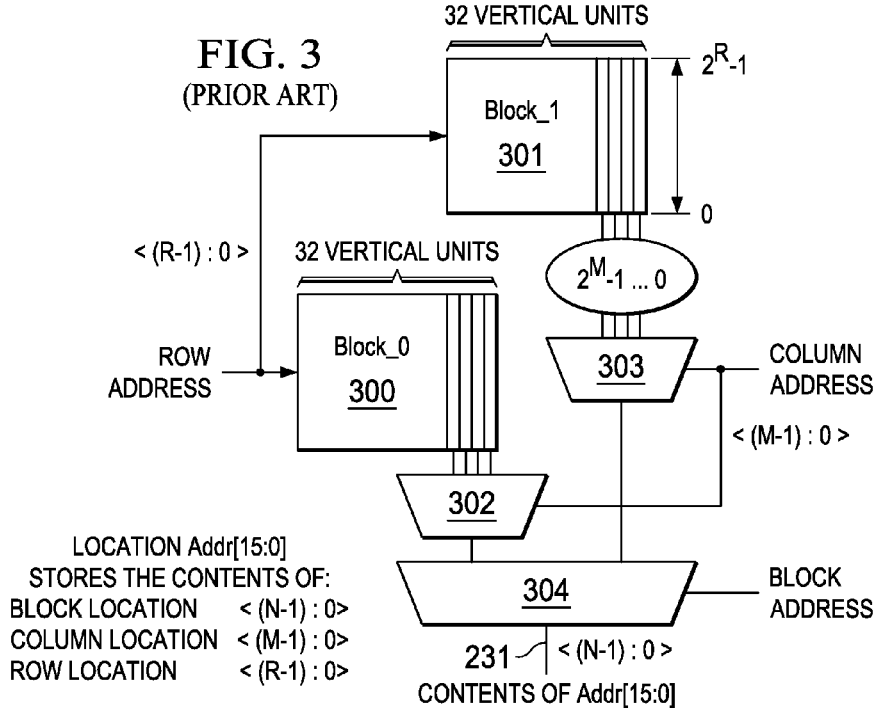
FIG. 3 is a diagram illustrating a prior art example two-block memory addressed by three address components: column address; row address; and block address.

FIG. 3 illustrates memory read portion of a prior art device included here as an example of how address scrambling may be used. In the example FIG. 3, the memory has N blocks, each block has M columns and each column has R rows. Output data from two memory blocks (block_0 300 and block_1 301 are selected by multiplexers 302, 303 and 304. Each of the thirty-two vertical units of block_0 300 and block_1 301 contain thirty-two rows of data, each row containing four eight-bit bytes labeled bytes 0 through 3.

Row address <R-1:0> supplies the row address input of block_0 300 and block_1 301 and selects one row out of rows $2^R-1$ to 0 in each block. Data from column $2^M-1$ to column 0 are output from block_0 300 to multiplexer 302. Column address <M-1:0> supplied to the control input of multiplexer 302 selects the data for the corresponding column. Similarly, data from column $2^M-1$ to column 0 are output from block_1 301 to multiplexer 303. Column address <M-1:0> supplied to the control input of multiplexer 303 selects the data for the corresponding column. The outputs of multiplexers 302 and 303 are supplied as inputs to multiplexer 304. Block address <N-1:0> supplied to the control input of multiplexer 304 selects data from the corresponding block for output as data 231.

In the memory of FIG. 3: a column address <(M-1):0> bits wide selects between M columns; a block address <(N-1):0> bits wide selects between N blocks of memory banks; and a row address <(R-1):0> bits wide selects between R rows of logical addresses inside each bank of memory.

FIG. 3 illustrates a partitioning of the example memory blocks. The example memory of FIG. 3 requires that the SRAM addresses have two-bit column addresses <0> and <1>, two-bit row A addresses <2> and <3>, a single-bit block address <4> and a three-bit row B address <5>, <6> and <7>. The address supplied to the memory is divided into these three sections. The positions of the above regions may vary from design to design.

The prior pBIST 130 illustrated in FIGS. 1 and 2 is designed for straightforward linear addressing. Row addresses are the address least significant bits (LSBs) <0> through <4>. Column addresses are bits <5> and <6>. The block address is bit <7>. Incrementing through these addresses would fetch data from row 0 through row 31 in sequential order in block_0 300 and then data from row 32 through 63 in sequential order in block_1 301.

The first pass of this linear addressing would address block_0 300 and proceed through all row addresses sequentially fetching all column 0 data first, and all column 1 data next, followed by column 2 data and finally column 3 data. The second pass of this linear addressing would address block_1 301 and proceed through all row addresses sequentially fetching all column 0 data first, and all column 1 data next, followed by column 2 data and finally column 3 data.

Figure 4:
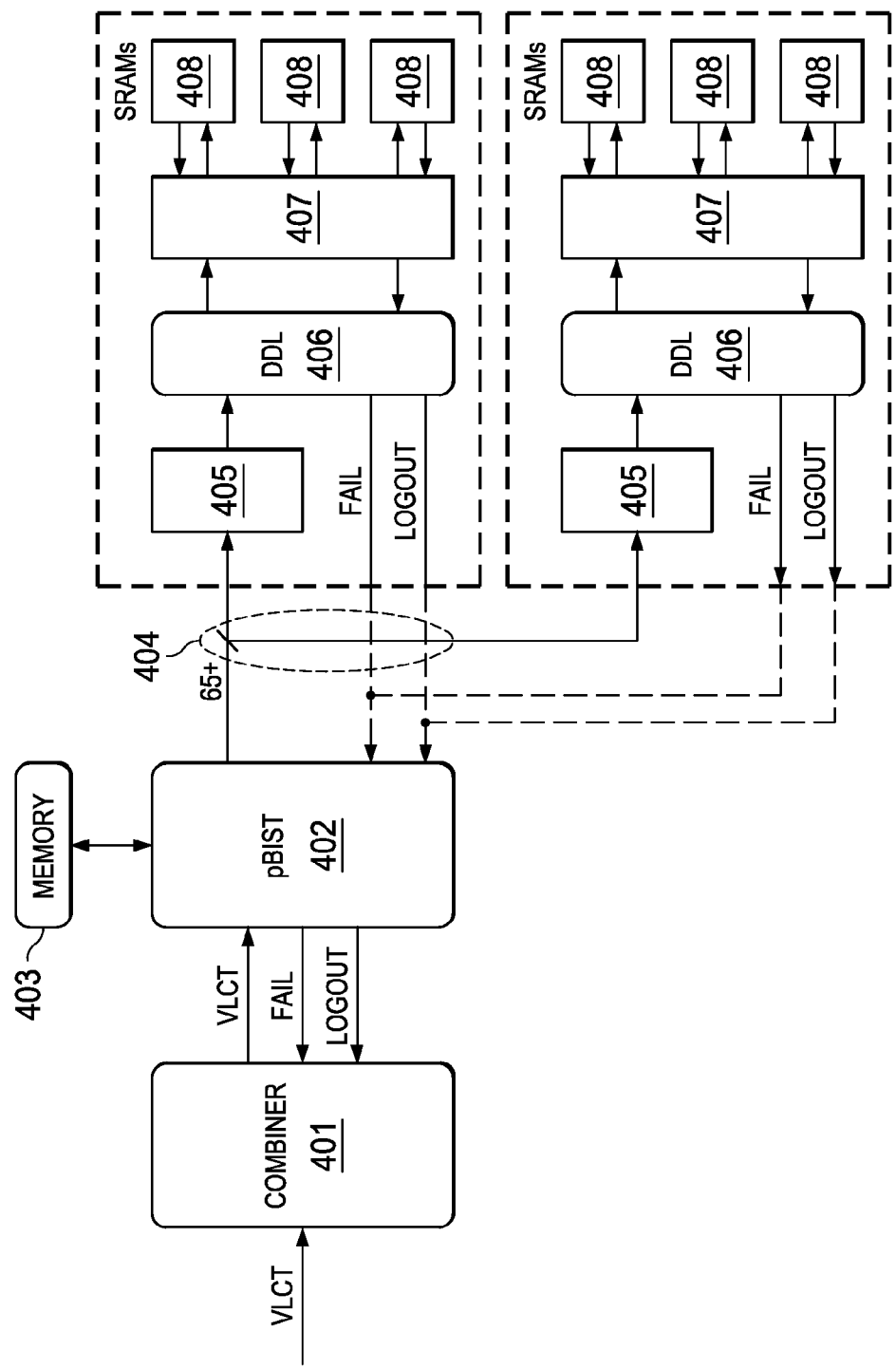
FIG. 4 shows the pBIST architecture with Distributed Data Logging.

The architecture demonstrated in FIG. 4 consists of a single pBIST, with a Distributed Data Logger system. Each sub chip incorporates a data logger that communicates with the controlling pBIST.

Data is input from the tester (VLCT) to combiner 401 to format the data, then to pBIST block 402, with pBIST memory 403. pBIST 402 communicates with the applicable sub chips via the compressed data bus, and receives fail and log information from each sub chip. The log information is presented in a serial manner to reduce the number of connections.

The sub chips may contain an asynchronous bridge 405 if they operate in a different voltage and/or clock domain from the pBIST. Asynchronous bridge 405 connects to distributed data logger 406 which communicates to control block 407. Block 407 expands the compressed data before writing the test pattern to memory 408, and then reads the result from 408. The comparison of the expected and actual memory data is performed in DDL 406. Since the comparison is done locally in each sub chip, there is no need to return the read data to the pBIST thus reducing the number of connections.

In a pBIST implementation, a plurality of embedded Random Access Memories (RAM) must be tested. Each embedded memory block may need different test algorithms and testing conditions, and the pBIST must be able to set up the testing process depending the actual memory selected. The setup data may be provided by the SOC tester, or it may be stored in the pBIST Read Only Memory (ROM).

In the prior art, the pBIST ROM stored the configuration data separately for each RAM block as shown in Table 1 where the ROM is divided into two sections. The first location stores the pointer to the beginning of the algorithm section (ALGO_PTR), and the second location stores the pointer to the beginning of the RAM Group Section. The algorithm section stores the test algorithm for the selected RAM, and the RAM Group Section stores the constants required for testing the selected RAM block. Table 2 shows the contents of the Ram Group Section.

This ROM structure is repeated for each embedded memory block that may be present.

TABLE 1

| ROM_ADDR | ROM CONTENT | COMMENTS |
|---|---|---|
| ... | ALGO_PTR | |
| | RAM_PTR | |
| | ... | ALGO SECTION |
| | ... | RAM GROUP SECTION |

TABLE 2

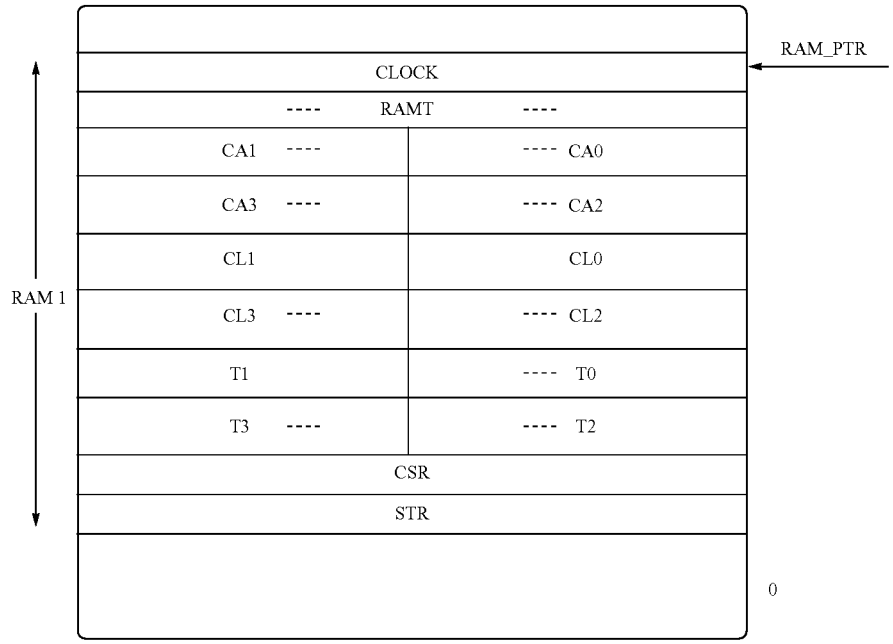

The current invention eliminates the duplication that may result from storing the setup constants separately for each embedded memory block. As shown in Table 3, a new ROM section called the Data Section is introduced, that will store only the memory type specific information. In each Ram Group Section we only store a pointer to the location where the constant data is stored, allowing the reuse of the data for similar instances of embedded RAM.

Table 4 shows the format of the Ram Group Section in this implementation.

TABLE 3

TABLE 3-continued

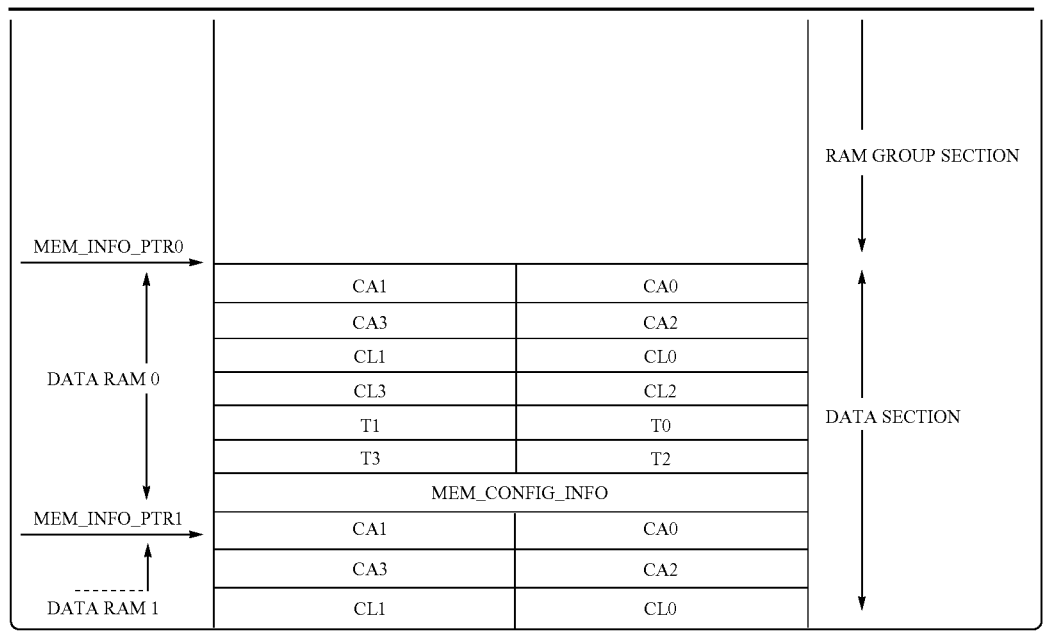

TABLE 4

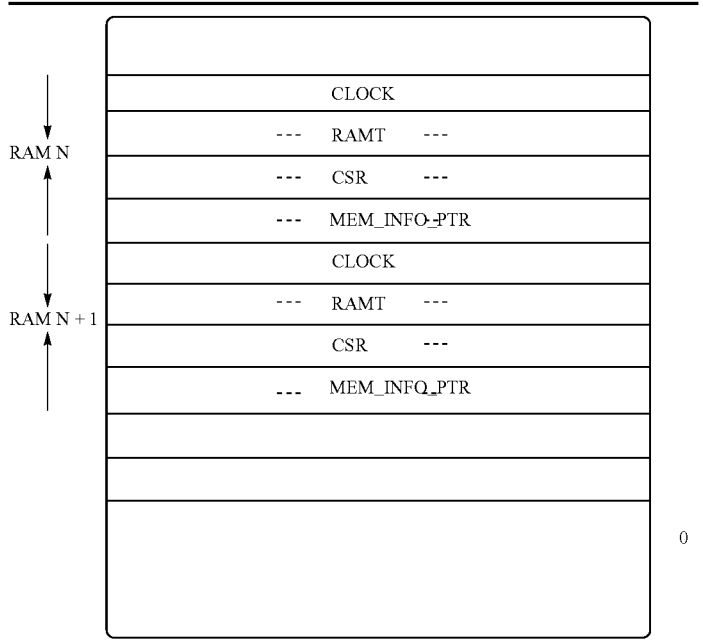

What is claimed is:

1. A System On Chip disposed on a single integrated circuit having an embedded memory test system comprising:
   a plurality of embedded random access memories having a plurality of memory types;
   a read only memory storing instructions for testing each of the plurality of types of embedded random access memories and data for testing the embedded random access memories; and
   a programmable Built In Self Test (pBIST) engine coupled to each of the plurality of embedded random access memories and to the read only memory, the pBIST engine operable to test each of the plurality of embedded random access memories employing instructions stored in the read only memory corresponding to the memory type of the embedded random access memory and data stored in the read only memory.

2. The embedded memory test system of claim 1 wherein:
the read only memory further stores setup conditions and constants required to test each of the plurality of memory types of the plurality of embedded random access memories.

3. The embedded memory test system of claim 2 wherein:
the read only memory further stores a single instance of the setup conditions and constants for each of the plurality of memory type of the plurality of embedded random access memories.

4. The embedded memory test system of claim 2 wherein:
the read only memory further stores a plurality of memory address pointers, each memory address pointer to a location where the setup conditions and constants for a corresponding one of the plurality of memory types of the plurality of random access memories is stored; and
the programmable built in test system is operable to retrieve the setup conditions and constants for a selected embedded random access memory by the use of the memory address pointer corresponding to the memory type of the selected embedded random access memory.

5. The embedded memory test system of claim 1 further comprising:
a central processing unit operable to perform data processing functions according to stored instructions, the central processing unit connected to at least one of the plurality of embedded memories in a manner not permitting back-to-back access to the embedded memory.

6. The embedded memory test system of claim 1 further comprising:
a plurality of distributed data loggers connected to the pBIST engine to a subset of the plurality of embedded memories, each of the plural distributed data loggers writing data received from the pBIST engine to a selected embedded memory of the subset of embedded memories,
reading data just written to the selected embedded memory,
comparing data received from the pBIST engine and data read from the selected embedded memory, and
transmitting a log information signal to the pBIST engine indicating whether the data received from the pBIST engine matches the data read from the selected embedded memory match.

7. The embedded memory test system of claim 6 wherein:
the pBIST engine transmits compressed data to each data logger unit; and
each data logger unit further comprises a decompression block receiving the compressed data from the pBIST engine and decompressing the compressed data before writing in the embedded memory.

8. The embedded memory test system of claim 6 wherein:
each distributed data logger transmits the log information in a serial manner.

9. The embedded memory test system of claim 6 wherein:
the pBIST engine operates within a first voltage/clock domain;
a subset of the plurality of embedded memories of a particular data logger operates within a second voltage/clock domain different from the first voltage/clock domain; and
the particular data logger includes an asynchronous bridge receiving data from the pBIST engine within the first voltage/clock domain and transmitting data to the subset of the plurality of embedded memories within the second voltage/clock domain.

* * * * *